US008431040B2

(12) United States Patent
Lyon et al.

(10) Patent No.: US 8,431,040 B2
(45) Date of Patent: Apr. 30, 2013

(54) SOLVENTS FOR PEDOT-SOLUTIONS FOR INK-JET PRINTING

(75) Inventors: Peter J. Lyon, Cambridge (GB); Julian Carter, Cambridgeshire (GB); Colin Creighton, Cambridge (GB); Haydn Gregory, San Jose, CA (US)

(73) Assignee: Cambridge Display Technology Limited, Cambridgeshire (GB)

( * ) Notice: Subject to any disclaimer, the term of this patent is extended or adjusted under 35 U.S.C. 154(b) by 841 days.

(21) Appl. No.: 11/915,141

(22) PCT Filed: May 19, 2006

(86) PCT No.: PCT/GB2006/001854
§ 371 (c)(1),
(2), (4) Date: May 21, 2008

(87) PCT Pub. No.: WO2006/123167
PCT Pub. Date: Nov. 23, 2006

(65) Prior Publication Data
US 2009/0121618 A1 May 14, 2009

(30) Foreign Application Priority Data
May 20, 2005 (GB) .................................. 0510382.5

(51) Int. Cl.
*C09K 11/06* (2006.01)
(52) U.S. Cl.
USPC ...... 252/301.16; 313/503; 313/504; 313/506; 428/690

(58) Field of Classification Search ............... 252/500, 252/301.16; 413/498, 504; 428/690; 525/54.2; 427/58; 313/506, 504, 503; 438/22; 347/20
See application file for complete search history.

(56) References Cited

U.S. PATENT DOCUMENTS

| | | | |
|---|---|---|---|
| 4,539,507 A | 9/1985 | VanSlyke et al. | |
| 6,551,727 B2 * | 4/2003 | Towns et al. | 428/690 |
| 6,878,312 B1 | 4/2005 | Kanbe et al. | |
| 7,294,960 B2 * | 11/2007 | Seki et al. | 313/504 |
| 7,390,438 B2 * | 6/2008 | Hsu et al. | 252/500 |
| 2001/0033136 A1 * | 10/2001 | Kawase | 313/506 |
| 2002/0011779 A1 * | 1/2002 | Towns et al. | 313/498 |
| 2003/0164477 A1 * | 9/2003 | Zhou et al. | 252/500 |
| 2004/0137652 A1 * | 7/2004 | Ishii | 438/22 |
| 2004/0183851 A1 * | 9/2004 | Nakamura | 347/20 |

(Continued)

FOREIGN PATENT DOCUMENTS

| | | |
|---|---|---|
| EP | 0 880 303 | 11/1998 |
| EP | 0 989 778 A1 | 3/2000 |

(Continued)

OTHER PUBLICATIONS

Carter et al., "Recent Developments in Materials and Processes for Ink Jet Printing High Resolution Polymer OLED Displays" Proc. SPIE, vol. 4800 (2003), pp. 34-46.*

(Continued)

*Primary Examiner* — Khanh Tuan Nguyen
(74) *Attorney, Agent, or Firm* — Marshall, Gerstein & Borun LLP

(57) ABSTRACT

A composition for ink jet printing an opto-electrical device, the composition comprising: an electroluminescent or charge transporting organic material; and a high boiling point solvent having a boiling point higher than water.

21 Claims, 7 Drawing Sheets

U.S. PATENT DOCUMENTS

| | | | | |
|---|---|---|---|---|
| 2004/0254297 A1* | 12/2004 | Hsu et al. | | 525/54.2 |
| 2005/0012465 A1* | 1/2005 | Uchida | | 315/169.3 |
| 2005/0057148 A1* | 3/2005 | Seki et al. | | 313/504 |
| 2005/0100658 A1* | 5/2005 | MacPherson et al. | | 427/58 |
| 2006/0011894 A1 | 1/2006 | Brabec et al. | | |
| 2006/0081816 A1 | 4/2006 | Brabec et al. | | |
| 2009/0121618 A1* | 5/2009 | Lyon et al. | | 313/504 |

FOREIGN PATENT DOCUMENTS

| | | | |
|---|---|---|---|
| EP | 1 103 590 | | 5/2001 |
| JP | 2003-229256 | * | 8/2003 |
| WO | WO-90/13148 | | 11/1990 |
| WO | WO-95/06400 | | 3/1995 |
| WO | WO-99/48160 | | 9/1999 |
| WO | WO-00/59267 | | 10/2000 |
| WO | WO-01/16251 | | 3/2001 |
| WO | WO-02/18513 | | 3/2002 |
| WO | WO-02/067343 A1 | | 8/2002 |
| WO | WO-02/069119 | | 9/2002 |
| WO | WO 02/069119 A1 | * | 9/2002 |
| WO | WO-03/048228 | | 6/2003 |
| WO | WO-03/048229 | | 6/2003 |
| WO | WO 03/048229 A1 | * | 6/2003 |
| WO | WO-03/065474 | | 8/2003 |
| WO | WO-03/083960 | | 10/2003 |
| WO | WO-03/106571 | | 12/2003 |
| WO | WO-03/107453 | | 12/2003 |
| WO | WO-2004/009304 | | 1/2004 |
| WO | WO-2004/049466 | | 6/2004 |
| WO | WO-2005/076386 | | 8/2005 |
| WO | WO-2005/100658 | | 10/2005 |
| WO | WO-2006/070186 | | 7/2006 |

OTHER PUBLICATIONS

Snaith et al., "Morphological and Electronic Consequences of Modifications to the Polymer Anode 'PEDOT:PSS'," Polymer, 46 (Jan. 2005), pp. 2573-2578.*

Handbook of Chemistry and Physics, 63$^{rd}$ Edition, CRC Press, 1982, p. C-289.*

Carter et al., "Recent Developments in Materials and Processes for Ink Jet Printing High Resolution Polymer OLED Displays," *Proc. SPIE*, 4800:34-46 (2003).

Snaith et al., "Morphological and Electronic Consequences of Modifications to the Polymer Anode 'PEDOT:PSS'," *Polymer*, 46(8):2573-2578 (2005).

International Search Report for International Application No. PCT/GB2006/001854, dated Aug. 4, 2006.

Written Opinion for International Application No. PCT/GB2006/001854, dated Aug. 4, 2006.

Baldo et al., "Very High-Efficiency Green Organic Light-Emitting Devices Based on Electroshoshphorescence," *Appl. Phys. Lett.*, 75(1):4-6 (1999).

Deegan et al., "Capillary Flow as the Cause of Ring Stains from Dried Liquid Drops," *Nature*, 389:827-829 (1997).

Duineveld et al., "Ink-Jet Printing of Polymer Light-Emitting Devices," *Proceedings of SPIE*, 4464:59-67 (2002).

Fleuster et al., "Mass Manufacturing of Full Colour Passive Matrix and Active Matrix PLED Displays," *SID Proceedings*, 4.2:1276-1279 (2004).

Hebner et al., "Ink-Jet Printing of Doped Polymers for Organic Light Emitting Devices," *Appl. Phys. Lett.*, 72(5):519-521 (1998).

Inca Dainippon Screen Group, "Welcome" (2007) Retrieved from the Internet on Jul. 10, 2007: URL:http://www.incadigital.com.

Ouyang et al., "On the Mechanism of Conductivity Enhancement in Poly(3,4-Ethylenedioxythiophene):Poly(styrene Sulfonate) Film Through Solvent Treatment," *Polymer*, 45:8443-8450 (2004).

Yang, "Review of Recent Progress on Polymer Electrolunninescent Devices," *SPIE Photonics West: Optoelectronics Conf.*, 3279 (1998).

Combined Search and Examination for Application No. GB0510382.5, dated Sep. 29, 2005.

International Preliminary Report on Patentability for International Application No. PCT/GB2006/001854, dated Nov. 23, 2007.

* cited by examiner

Figure 8(a) and (b)

SOLVENTS FOR PEDOT-SOLUTIONS FOR INK-JET PRINTING

FIELD OF INVENTION

This invention relates to compositions for ink jet printing conductive or semi-conductive organic material, opto-electrical devices manufactured using these compositions, and methods of manufacturing these opto-electrical devices.

BACKGROUND OF INVENTION

One class of opto-electrical devices is that using an organic material for light emission (or detection in the case of photovoltaic cells and the like). The basic structure of these devices is a light emissive organic layer, for instance a film of a poly (p-phenylenevinylene) ("PPV") or polyfluorene, sandwiched between a cathode for injecting negative charge carriers (electrons) and an anode for injecting positive charge carriers (holes) into the organic layer. The electrons and holes combine in the organic layer generating photons. In WO90/13148 the organic light-emissive material is a polymer. In U.S. Pat. No. 4,539,507 the organic light-emissive material is of the class known as small molecule materials, such as (8-hydroxyquinoline) aluminium ("Alq3"). In a practical device one of the electrodes is transparent, to allow the photons to escape the device.

A typical organic light-emissive device ("OLED") is fabricated on a glass or plastic substrate coated with a transparent anode such as indium-tin-oxide ("ITO"). A layer of a thin film of at least one electroluminescent organic material covers the first electrode. Finally, a cathode covers the layer of electroluminescent organic material. The cathode is typically a metal or alloy and may comprise a single layer, such as aluminium, or a plurality of layers such as calcium and aluminium.

In operation, holes are injected into the device through the anode and electrons are injected into the device through the cathode. The holes and electrons combine in the organic electroluminescent layer to form an exciton which then undergoes radiative decay to give light (in light detecting devices this process essentially runs in reverse).

These devices have great potential for displays. However, there are several significant problems. One is to make the device efficient, particularly as measured by its external power efficiency and its external quantum efficiency. Another is to optimise (e.g. to reduce) the voltage at which peak efficiency is obtained. Another is to stabilise the voltage characteristics of the device over time. Another is to increase the lifetime of the device.

To this end, numerous modifications have been made to the basic device structure described above in order to solve one or more of these problems.

One such modification is the provision of a layer of conductive polymer between the light-emissive organic layer and one of the electrodes. It has been found that the provision of such a conductive polymer layer can improve the turn-on voltage, the brightness of the device at low voltage, the efficiency, the lifetime and the stability of the device. In order to achieve these benefits these conductive polymer layers typically may have a sheet resistance less than $10^6$ Ohms/square, the conductivity being controllable by doping of the polymer layer. It may be advantageous in some device arrangements to not have too high a conductivity. For example, if a plurality of electrodes are provided in a device but only one continuous layer of conductive polymer extending over all the electrodes, then too high a conductivity can lead to lateral conduction and shorting between electrodes.

The conductive polymer layer may also be selected to have a suitable workfunction so as to aid in hole or electron injection and/or to block holes or electrons. There are thus two key electrical features: the overall conductivity of the conductive polymer composition; and the workfunction of the conductive polymer composition. The stability of the composition and reactivity with other components in a device will also be critical in providing an acceptable lifetime for a practical device. The processability of the composition will be critical for ease of manufacture.

Conductive polymer formulations are discussed in the applicant's earlier application GB-A-0428444.4. There is an ongoing need to optimise the organic formulations used in these devices both in the light emitting layer and the conductive polymer layer.

OLEDs can provide a particularly advantageous form of electro-optic display. They are bright, colourful, fast-switching, provide a wide viewing angle and are easy and cheap to fabricate on a variety of substrates. Organic (which here includes organometallic) LEDs may be fabricated using either polymers or small molecules in a range of colours (or in multi-coloured displays), depending upon the materials used. As previously described, a typical OLED device comprises two layers of organic material, one of which is a layer of light emitting material such as a light emitting polymer (LEP), oligomer or a light emitting low molecular weight material, and the other of which is a conductive polymer layer, for example a layer of a hole transporting material such as a polythiophene derivative or a polyaniline derivative.

Organic LEDs may be deposited on a substrate in a matrix of pixels to form a single or multi-colour pixellated display. A multicoloured display may be constructed using groups of red, green, and blue emitting pixels. So-called active matrix displays have a memory element, typically a storage capacitor and a transistor, associated with each pixel whilst passive matrix displays have no such memory element and instead are repetitively scanned to give the impression of a steady image.

FIG. 1 shows a vertical cross section through an example of an OLED device 100. In an active matrix display, part of the area of a pixel is occupied by associated drive circuitry (not shown in FIG. 1). The structure of the device is somewhat simplified for the purposes of illustration.

The OLED 100 comprises a substrate 102, typically 0.7 mm or 1.1 mm glass but optionally clear plastic, on which an anode layer 106 has been deposited. The anode layer typically comprises around 150 nm thickness of ITO (indium tin oxide), over which is provided a metal contact layer, typically around 500 nm of aluminium, sometimes referred to as anode metal. Glass substrates coated with ITO and contact metal may be purchased from Corning, USA. The contact metal (and optionally the ITO) is patterned as desired so that it does not obscure the display, by a conventional process of photolithography followed by etching.

A substantially transparent hole transport layer 108a is provided over the anode metal, followed by an electroluminescent layer 108b. Banks 112 may be formed on the substrate, for example from positive or negative photoresist material, to define wells 114 into which these active organic layers may be selectively deposited, for example by a droplet deposition or inkjet printing technique. The wells thus define light emitting areas or pixels of the display.

A cathode layer 110 is then applied by, say, physical vapour deposition. The cathode layer typically comprises a low work function metal such as calcium or barium covered with a thicker, capping layer of aluminium and optionally including an additional layer immediately adjacent the electroluminescent layer, such as a layer of lithium fluoride, for improved electron energy level matching. Mutual electrical isolation of cathode lines may achieved through the use of cathode separators (element 302 of FIG. 3b). Typically a number of displays are fabricated on a single substrate and at the end of the fabrication process the substrate is scribed, and the displays separated. An encapsulant such as a glass sheet or a metal can is utilized to inhibit oxidation and moisture ingress.

Organic LEDs of this general type may be fabricated using a range of materials including polymers, dendrimers, and so-called small molecules, to emit over a range of wavelengths at varying drive voltages and efficiencies. Examples of polymer-based OLED materials are described in WO90/13148, WO95/06400 and WO99/48160; examples of dendrimer-based materials are described in WO 99/21935 and WO 02/067343; and examples of small molecule OLED materials are described in U.S. Pat. No. 4,539,507. The aforementioned polymers, dendrimers and small molecules emit light by radiative decay of singlet excitons (fluorescence). However, up to 75% of excitons are triplet excitons which normally undergo non-radiative decay. Electroluminescence by radiative decay of triplet excitons (phosphorescence) is disclosed in, for example, "Very high-efficiency green organic light-emitting devices based on electrophosphorescence" M. A. Baldo, S. Lamansky, P. E. Burrows, M. E. Thompson, and S. R. Forrest Applied Physics Letters, Vol. 75(1) pp. 4-6, Jul. 5, 1999". In the case of a polymer-based OLED, layers 108 comprise a hole transport layer 108a and a light emitting polymer (LEP) electroluminescent layer 108b. The electroluminescent layer may comprise, for example, around 70 nm (dry) thickness of PPV (poly(p-phenylenevinylene)) and the hole transport layer, which helps match the hole energy levels of the anode layer and of the electroluminescent layer, may comprise, for example, around 50-200 nm, preferably around 150 nm (dry) thickness of PEDOT:PSS (polystyrene-sulphonate-doped polyethylene-dioxythiophene).

FIG. 2 shows a view from above (that is, not through the substrate) of a portion of a three-colour active matrix pixellated OLED display 200 after deposition of one of the active colour layers. The figure shows an array of banks 112 and wells 114 defining pixels of the display.

FIG. 3a shows a view from above of a substrate 300 for inkjet printing a passive matrix OLED display. FIG. 3b shows a cross-section through the substrate of FIG. 3a along line Y-Y'.

Referring to FIGS. 3a and 3b, the substrate is provided with a plurality of cathode undercut separators 302 to separate adjacent cathode lines (which will be deposited in regions 304). A plurality of wells 308 is defined by banks 310, constructed around the perimeter of each well 308 and leaving an anode layer 306 exposed at the base of the well. The edges or faces of the banks are tapered onto the surface of the substrate as shown, heretofore at an angle of between 10 and 40 degrees. The banks present a hydrophobic surface in order that they are not wetted by the solution of deposited organic material and thus assist in containing the deposited material within a well. This is achieved by treatment of a bank material such as polyimide with an $O_2/CF_4$ plasma as disclosed in EP 0989778. Alternatively, the plasma treatment step may be avoided by use of a fluorinated material such as a fluorinated polyimide as disclosed in WO 03/083960.

As previously mentioned, the bank and separator structures may be formed from resist material, for example using a positive (or negative) resist for the banks and a negative (or positive) resist for the separators; both these resists may be based upon polyimide and spin coated onto the substrate, or a fluorinated or fluorinated-like photoresist may be employed.

In the example shown the cathode separators are around 5 μm in height and approximately 20 μm wide. Banks are generally between 20 μm and 100 μm in width and in the example shown have a 4 μm taper at each edge (so that the banks are around 1 μm in height). The pixels of FIG. 3a are approximately 300 μm square but, as described later, the size of a pixel can vary considerably, depending upon the intended application.

The deposition of material for organic light emitting diodes (OLEDs) using ink jet printing techniques are described in a number of documents including, for example: T. R. Hebner, C. C. Wu, D. Marcy, M. H. Lu and J. C. Sturm, "Ink-jet Printing of doped Polymers for Organic Light Emitting Devices", *Applied Physics Letters, Vol.* 72, No. 5, pp. 519-521, 1998; Y. Yang, "Review of Recent Progress on Polymer Electroluminescent Devices," *SPIE Photonics West: Optoelectronics* '98, Conf. 3279, San Jose, January, 1998; EP 0 880 303; and "Ink-Jet Printing of Polymer Light-Emitting Devices", Paul C. Duineveld, Margreet M. de Kok, Michael Buechel, Aad H. Sempel, Kees A. H. Mutsaers, Peter van de Weijer, Ivo G. J. Camps, Ton J. M. van den Biggelaar, Jan-Eric J. M. Rubingh and Eliav I. Haskal, Organic Light-Emitting Materials and Devices V, Zakya H. Kafafi, Editor, Proceedings of SPIE Vol. 4464 (2002). Ink jet techniques can be used to deposit materials for both small molecule and polymer LEDs.

A volatile solvent is generally employed to deposit a molecular electronic material, with 0.5% to 4% dissolved material. This can take anything between a few seconds and a few minutes to dry and results in a relatively thin film in comparison with the initial "ink" volume. Often multiple drops are deposited, preferably before drying begins, to provide sufficient thickness of dry material. Typical solvents which have been used include cyclohexylbenzene and alkylated benzenes, in particular toluene or xylene; others are described in WO 00/59267, WO 01/16251 and WO 02/18513; a solvent comprising a blend of these may also be employed. Precision ink jet printers such as machines from Litrex Corporation of California, USA are used; suitable print heads are available from Xaar of Cambridge, UK and Spectra, Inc. of NH, USA. Some particularly advantageous print strategies are described in the applicant's UK patent application number 0227778.8 filed on 28 Nov. 2002.

Inkjet printing has many advantages for the deposition of materials for molecular electronic devices but there are also some drawbacks associated with the technique. As previously mentioned the photoresist banks defining the wells have until now usually been tapered to form a shallow angle, typically around 15°, with the substrate. However it has been found that dissolved molecular electronic material deposited into a well with shallow edges dries to form a film with a relatively thin edge. FIGS. 4a and 4b illustrate this process.

FIG. 4a shows a simplified cross section 400 through a well 308 filled with dissolved material 402, and FIG. 4b shows the same well after the material has dried to form a solid film 404. In this example the bank angle is approximately 15° and the bank height is approximately 1.5 μm. As can be seen a well is generally filled until it is brimming over. The solution 402 has a contact angle $\theta_c$ with the plasma treated bank material of typically between 30° and 40° for example around 35°; this is the angle the surface of the dissolved material 402 makes with the (bank) material it contacts, for example angle 402a in FIG. 4a. As the solvent evaporates the solution becomes more concentrated and the surface of the solution moves down the tapering face of a bank towards the substrate; pinning of the drying edge can occur at a point between the initially landed wet edge and the foot of the bank (base of the well) on the substrate. The result, shown in FIG. 4b, is that the film of dry material 404 can be very thin, for example of the order of 10 nm or less, in a region 404a where it meets the face of a bank. In practice drying is complicated by other effects such as the coffee ring—effect. With this effect because the thickness of solution is less at the edge of a drop than in the centre, as the edge dries the concentration of dissolved material there increases. Because the edge tends to be pinned solution then flows from the centre of the drop towards the edge to reduce the concentration gradiant. This effect can result in dissolved material tending to be deposited in a ring rather than uniformly. The physics of the interactions of a drying solution with a surface are extremely complicated and a complete theory still awaits development.

Another drawback of banks with a long-shallow taper is that an inkjet droplet that does not fall exactly into a well but instead lands in part on the slope of the bank can dry in place, resulting in non-uniformities in the end display.

A further problem with inkjet deposition arises when filling wells which are large compared with the size of an inkjet droplet. A typical droplet from an inkjet print head has a diameter of approximately of 30 µm in flight and the droplet grows to approximately 100 µm in diameter when it lands and wets out. However it is difficult to produce drops of, say 100 µm in diameter (in flight) from a print head.

Filling a well or pixel of a similar size to a drop presents little problem as when the drop lands it spreads out and fills the well. This is illustrated in FIG. 5a which shows a well 500 for a long thin pixel of a type which is typically used in a RGB (red green blue) display. In the example of FIG. 5a the pixel has a width of 50 µm and a length of 150 µm with 20 µm wide banks (giving a 70 µm pixel pitch and a 210 µm full colour pitch). Such a well can be filled by three 50 µm droplets 502a, b, c as shown. Referring now to FIG. 5b this shows a well 510 for a pixel which is approximately four times larger than each dimension giving a pixel width of approximately 200 µm, more suitable for applications such as a colour television. As can be seen from the figure, many droplets 512 are needed to fill such a pixel. In practice, these tend to coalesce to form a larger droplet 514 which tends not to properly fill corners of the pixel (although FIGS. 5a and 5b and idealised and, in practice, the corners are not generally as sharp as they are shown). One way around this problem is to sufficiently over fill the well that the dissolved material well is pushed into the corners. This can be achieved by using a large number of dilute droplets and a high barrier around the well. Techniques for depositing large volumes of liquid are described in WO03/065474, which describes the use of very high barriers (for examples at page 8 lines 8 to 20) to allow the wells to hold a large volume of liquid without the liquid overflowing to adjacent wells. However such structures cannot easily be formed by photolithography and instead a plastic substrate is embossed or injection moulded. It is also desirable to be able to fill a well using fewer (higher concentration) droplets as this enables, inter alia faster printing.

One solution to the aforementioned problems is to modify the bank structure as described in the present applicant's earlier application GB-A-0402559.9.

Another problem associated with ink jet printing of organic opto-electrical devices such as those discussed above is that in the resultant device, the organic hole injecting layer can extend beyond the overlying organic semi-conductive layer providing a shorting path between the cathode and the anode at an edge of the well. This problem is exacerbated if the contact angle of the conductive organic composition with the bank material is too low. This problem is further exacerbated if the conductivity of the organic hole injecting layer is too high.

One solution to the aforementioned problem is to modify the bank structure by, for example, providing a stepped bank structure which increases the length of the shorting path, thus increasing the resistance of the path resulting in less shorting. Such a solution has been proposed by Seiko Epson. However, providing a more complex bank structure is expensive and increases the complexity of the manufacturing method for the device.

In relation to the aforementioned problem, the more conductive the organic composition, the greater the shorting problem will become. Thus, addition of polyol solvents to PEDOT in order to increase their conductivity as described in WO 2003/048229 (which discloses PEDOT with ethylene glycol, diethylene glycol and glycerol), WO 2003/048228 (which discloses PEDOT with diethylene glycol), and Polymer (2004), 45(25), 8443-8450 (which discloses PEDOT with ethylene glycol) will exacerbate this problem. Furthermore, although ink jet printing is mentioned in passing in these documents, the deposition techniques exemplified in these documents are not ink jet printing and the formulations disclosed appear to be too viscous for ink jet printing as a result of the high concentration of the polyol solvents utilized in these compositions.

The present applicant seeks to solve, or at least reduce, the problems outlined above by adapting compositions for ink jet printing comprising conductive or semi-conductive organic material. These adapted compositions are of particular use in the manufacture of light-emissive devices.

The feasibility of using ink jet printing to define hole conduction and electroluminescent layers in OLED display has been well demonstrated. The particular motivation for ink jet printing has been driven by the prospect of developing scalable and adaptable manufacturing processes, enabling large substrate sizes to be processed, without the requirement for expensive product specific tooling. In this application the implication of scalable and adaptable criteria for an ink jet print process are discussed and it is demonstrated how this can be achieved by development of suitable ink formulations.

The last five years have seen an increasing activity in the development of ink jet printing for depositing electronic materials. In particular there have been demonstrations of ink jet printing of both hole conduction (HC) and electroluminescent (EL) layers of OLED devices by more than a dozen display manufacturers. A number of these companies have set up pilot production facilities and have indicated that mass manufacture will start in 2007-2008 timeframe [M. Fleuster, M. Klein, P. v. Roosmalen, A. de Wit, H. Schwab. Mass Manufacturing of Full Colour Passive Matrix and Active Matrix PLED Displays. SID Proceedings 2004, 4.2].

The key reasons for the interest in ink jet printing are scalability and adaptability. The former allows arbitrarily large sized substrates to be patterned and the latter should mean that there are negligible tooling costs associated with changing from one product to another since the image of dots printed on a substrate is defined by software. At first sight this would be similar to printing a graphic image—commercial print equipment is available that allow printing of arbitrary images on billboard sized substrates. However the significant difference between graphics printers and display panels is the former use substrates that are porous or use inks that are UV curable resulting in very little effect of the drying environment on film formation. In comparison, the inks used in fabricating OLED displays are ink jet printed onto non-porous surfaces and the process of changing from a wet ink to dry film is dominated by the drying environment of the ink in the pixel. Since the printing process involves printing stripes (or swathes) of ink (corresponding to the ink jet head width) there is an inbuilt asymmetry in the drying environment. In addition OLED devices require the films to be uniform to nanometer tolerance. It follows that to achieve scalability and adaptability requires control of the film forming properties of the ink and a robustness of this process to changes in pixel dimensions and swathe timing. In this application it is demonstrated how this can be achieved with suitable ink engineering.

In general terms, the behaviour of drying drops of HC and EL inks is explained by the coffee-ring effect first modelled by Deegan [R. D. Deegan, O. Bakajin, T. F. Dupont, G. Huber, S. R. Nagel, and T. A. Witten. Capillary flow as the cause of ring stains from dried liquid drops. Nature 389, 827 (1997)]. For the case of circular pixels the wet ink forms a section of a sphere, where the angle made by the drop surface with the substrate is the contact angle. When pinning occurs (which it invariably does for the inks and surfaces used in polymer OLED display manufacturing) the drying drop maintains its diameter and solute is carried to the edges of the drop forming a ring of material at the outer edges of the pixel. The amount of material carried to the edge depends on a number of factors—in particular how long the process of material transfer can occur before the drying drop gels and the uniformity of the drying environment. At a swathe edge more drying occurs on the unprinted side since the solvent concentration in the atmosphere above the substrate is less than the printed side. With more evaporation taking place on the unprinted side more solute is deposited on this side and the film profile becomes asymmetric.

Embodiments of the present invention seek to solve the problem associated with a rapid change in the profile of organic layers within the pixels and between the pixels surrounding a swathe join.

SUMMARY OF THE PRESENT INVENTION

According to an aspect of the present invention there is provided a composition for ink jet printing an opto-electrical device, the composition comprising: a conductive or semiconductive organic material; and a high boiling point solvent having a boiling point higher than water.

The solubility, processability and functional properties of the organic material may be very sensitive to changes in solvent. Accordingly, it may be advantageous to retain a portion of solvent in which the organic material is stable. As such, according to another aspect of the present invention there is provided a composition comprising a conductive or semiconductive organic material, a first solvent, and a second solvent, wherein the second solvent has a higher boiling point that the first solvent. The first solvent will typically be the usual solvent used for the organic material for achieving good solubility, processability and conductance characteristics.

The provision of a high boiling point solvent increases the drying time of the composition. Thus, during ink jet printing, the amount of evaporation occurring in the time between deposition of adjacent swathes is reduced leading to a greater uniformity of drying and a more symmetric film formation around a swathe join.

Typically, there will only be a few seconds until the next swathe is printed. However, due to the high surface to volume ratio of an ink, drying times are in the order of seconds. As a result significant drying can occur prior to deposition of an adjacent swathe. By using high boiling point solvents, the amount of evaporation occurring in this time can be reduced.

Once adjacent swathes have been deposited the drying environment becomes symmetrical resulting in symmetric layer profiles around the swathe join.

The amount and type of high boiling point solvent to be added to a composition will be dependent on how much of a reduction in drying time is desired. This will be dependent on the time taken to print adjacent swathes. Thus, for slower printing times, a slower drying composition is desirable and a larger volume and/or higher boiling point solvent will be required. However, adding too much high boiling point solvent or the wrong type of solvent may have several problematic affects as discussed below.

The amount and/or type of solvent to be used will depend on the speed of ink jet printing (how much time it takes to print successive swathes). The amount and/or type of solvent will also depend on the surface to volume ratio of the ink droplet. For larger ink droplets, evaporation will be slower and for a given print speed, a lower boiling point solvent will be required when compared to an arrangement utilizing smaller droplets. One key feature of embodiments of the present invention is that the print speed, the droplet size/well size, and the boiling point of the solvent are selected such that when a first swathe and a second swathe are successively printed adjacent to each other, the print rate is such that the first swathe does not significantly dry prior to completing printing of the second swathe.

Preferably, the high boiling solvent is present in the composition in a proportion between 10% and 50%, 20% and 40% or approximately 30% by volume. Preferably, the boiling point of the solvent is between 110 and 400 degrees centigrade, 150 and 250 degrees centigrade, or 170 and 230 degrees centigrade.

For small pixels a higher solid content is generally used. For larger pixels a lower solid content is used. For larger pixels, the concentration of the composition is reduced to get good film forming properties.

If the solvent is very viscous then it can become difficult to ink jet print the composition. If the viscosity of the composition becomes too high then it will not be suitable for ink jet printing without heating the print head. Embodiments of the present invention are preferably of a viscosity such that heating of the print head is not required in order to ink jet print the compositions.

Furthermore, if the contact angle between the solvent and the material of the banks is too large, then the banks may not be sufficiently wetted. Conversely, if the contact angle between the solvent and the banks is too small, then the banks may not contain the composition leading to flooding of the wells.

Thus, selecting an arbitrary high boiling point solvent can alter the wetting characteristics of the composition. For example, if the contact angle between the composition and the bank is too large then on drying the film has thin edges resulting in non-uniform emission. Alternatively, if the contact angle between the composition and the bank is too small then the well will flood. With such an arrangement, on drying, conductive/semi-conductive organic material will be deposited over the bank structure leading to problems of shorting.

Preferably, the composition should have a contact angle with the bank such that it wets the bank but does not flood out of the well. With this arrangement, on drying a coffee ring effect occurs resulting in a thickening of the edges. A more uniform film morphology results producing a more uniform emission in the finished device.

If the contact angle between the electroluminescent material and the conductive material is too high then the conductive material will not be sufficiently wetted by the electroluminescent material.

One solution to the problem of flooding is to select a high boiling point solvent which has a sufficient contact angle such that it is adequately contained in the wells. Conversely, one solution to the problem of insufficient wetting of the banks is to select a high boiling point solvent which does not have a high contact angle with the material of the base of the well and does not have a contact angle with the banks which is too high.

The problem of insufficient wetting or flooding can be controlled by the addition of a suitable surfactant to modify the contact angle such that the well is sufficiently wetted without flooding. The provision of a surfactant can also produce flatter film morphologies. Preferably, the surfactant is present in a low amount so as to avoid changing other aspects of the composition's behaviour. For example, the range 0.5-5%, 0.5-3% or 1-2% by volume has been found to be sufficient in many ink formulations. Examples of suitable surfactants include glycol ethers such as ethylene glycol ethers and propylene glycol ethers. A preferred surfactant is 2-butoxyethanol. It will be understood that these additives are not conventional surfactants. However, they do act as surface-active agents in the present compositions and thus may be thought of as surfactants in the context of the present invention.

The viscosity will also be dependent on the solid content (the viscosity increases with solid content). The viscosity should be such that the composition is jettable. The solid content of the composition may be between 0.5% and 6%, 1% and 4%, 1% and 2%, and in some cases is preferably 1.5%. The solid content also affects the form of the film after drying. If the solid content is too high then the film forms a dome shape whereas if the solid content is too low then an excessive coffee ring effect occurs.

A further problem in using high boiling point solvents is that the conductivity of the composition may be modified by the high boiling point solvent. One solution to this problem is to select a solvent which does not significantly modify the composition's conductivity. Alternatively, or additionally, a conductivity modifier may be included in the composition to compensate for any change in conductivity caused by the high boiling point solvent. For example, the inclusion of a high boiling point solvent can result in an increase in the conductivity of the composition resulting in problems due to shorting between electrodes. Accordingly, in one arrangement, a conductivity modifier is included in the composition in order to reduce the conductivity of the composition.

Following on from the above, a particular problem in organic opto-electrical devices is that the conductive organic hole injecting layer may extend beyond the overlying organic semi-conductive layer providing a shorting path between the cathode deposited thereover and the underlying anode. This problem is exacerbated if the contact angle of the conductive organic composition with the bank material is too low. This problem is further exacerbated if the conductivity of the organic hole injecting layer is high. This problem is further exacerbated if the contact angle of the electroluminescent composition with the conductive layer is too large.

One solution to this problem is to modify the bank structure, by, for example, providing a stepped bank structure which increases the length of the shorting path, thus increasing the resistance of the path resulting in less shorting. However, providing a more complex bank structure is expensive and increases the complexity of the manufacturing method for the device.

Accordingly, it would be advantageous to solve this problem without requiring a complex bank structure by tailoring the compositions deposited in the wells such that underlying layers do not extend beyond the layers deposited thereover and provide a shorting path between the electrodes. This may be done, for example, by tailoring the conductive organic composition such that the contact angle between the conductive polymer composition and the bank material is not too low, and/or tailoring the conductive organic composition so that its conductivity is not too high, and/or tailoring the electroluminescent composition and/or the conductive composition such that the contact angle therebetween is not too high.

Asymmetric drying at the swathe join can also lead to shorting paths being created at the swathe join. Accordingly, the use of a high boiling point solvent which alleviates asymmetric drying will also reduce the shorting problem caused by poor film morphologies. The present applicant has found that in some cases quite the opposite effect occurs, i.e. the addition of a high boiling point solvent increases shorting at the swathe joins. This has been found to be due to an increase in the conductivity of the conductive polymer film. Thus, in such cases, a conductivity modifier can be used to reduce the conductivity.

The high boiling point solvent may comprise one or more of ethylene glycol, glycerol, diethylene glycol, propylene glycol, butane 1,4 diol, propane 1,3 diol, dimethyl-2-imidazolidinone, N-methyl-2-pyrrolidone and dimethylsulfoxide, either alone or in a blend.

The high boiling point solvent is preferably a polyol (e.g. ethylene glycol, diethylene glycol, glycerol). It has been found that these solvent improve film uniformity within the pixels and across swathe joins. Furthermore, they do not compromise other aspect of the ink's performance.

It has been found that the composition has a greater wetting capacity on the banks when the solvent used is more "organic" i.e. it has less hydroxyl groups. Thus, diols will have a higher wetting capacity than triols.

A light-emitting layer may be deposited as a composition comprising a semi-conductive organic material in a high boiling point solvent. Preferably, the organic material comprises a polymer and most preferably the polymer is either fully or partially conjugated.

A charge injecting layer may be deposited as a composition comprising a conductive organic material in a high boiling point solvent. Preferably, the organic material comprises a polymer and most preferably the organic material comprises PEDOT with a suitable polyanion, for example PSS.

Embodiments of the present invention relate to new PEDOT ink formulations for improved film uniformity within pixels and across swathe joins. Slower drying inks have been formulated which do not compromise other aspects of the ink's performance. This provides an alternative to interlacing which is very slow.

The present applicant has found that the problem of film non-uniformity in PEDOT is very important to device performance. The device performance may not be directly affected significantly by the thickness of the PEDOT film. However, the uniformity of the PEDOT film affects the uniformity of the overlying electroluminescent layer. The EL layer is very sensitive to changes in thickness. Accordingly, the present applicant has found that it is paramount that uniform films of PEDOT profiles are achieved in order to achieve uniform EL profiles.

In the case of PEDOT, it has been found that the swathe join effect is sensitive to the ratio of PEDOT:counterion. Higher counterion compositions result in a decrease in the problem. Preferably, the ratio of PEDOT:counterion is in the range 1:20 and 1:75, 1:20 and 1:50, 1:25 and 1:45, or 1:30 and 1:40.

For example, in one embodiment, a PEDOT:PSS composition of 1:20 gives a poor swathe join, a composition of 1:30 gives a good swathe join, and a composition of 1:40 completely eliminates the swathe join effect. An increase in PSS decreases the conductivity of the composition. Accordingly, the excess PSS (above 1:20) is acting as an insulating material/conductivity modifier. PSS also increases surface energy thus aiding wetting.

According to another aspect of the present invention there is provided a method of manufacturing an opto-electical device by inkjet printing a composition according to any preceding claim. For example, a method of forming a device by inkjet printing of a formulation comprising PEDOT (or possibly other hole injection materials) and a high-boiling point solvent (higher than water).

According to another aspect of the present invention there is provided an opto-electrical device formed using the compositions described herein.

According to yet another aspect of the present invention there is provided a method of manufacturing an organic light-emissive display comprising: providing a substrate comprising a first electrode layer and a bank structure defining a plurality of wells; depositing a conductive polymer layer over the first electrode; deposition an organic light-emissive layer over the conductive polymer layer; and depositing a second electrode over the organic light-emissive layer, wherein at least one of the conductive polymer layer and the organic light-emissive layer is deposited by ink jet printing a composition as described herein into the plurality of wells.

BRIEF SUMMARY OF THE DRAWINGS

Embodiments of the present invention will now be described, by way of example only, with reference to the accompanying drawings in which.

DETAILED DESCRIPTION OF PREFERRED EMBODIMENTS

The present invention will be described in relation to an electroluminescent display comprising a PEDOT hole injecting layer and a semiconductive polymer electroluminescent layer comprising conjugated or partially conjugated polymer material. In particular, the composition of PEDOT formulations for the hole injecting layer are described.

Figure 1:
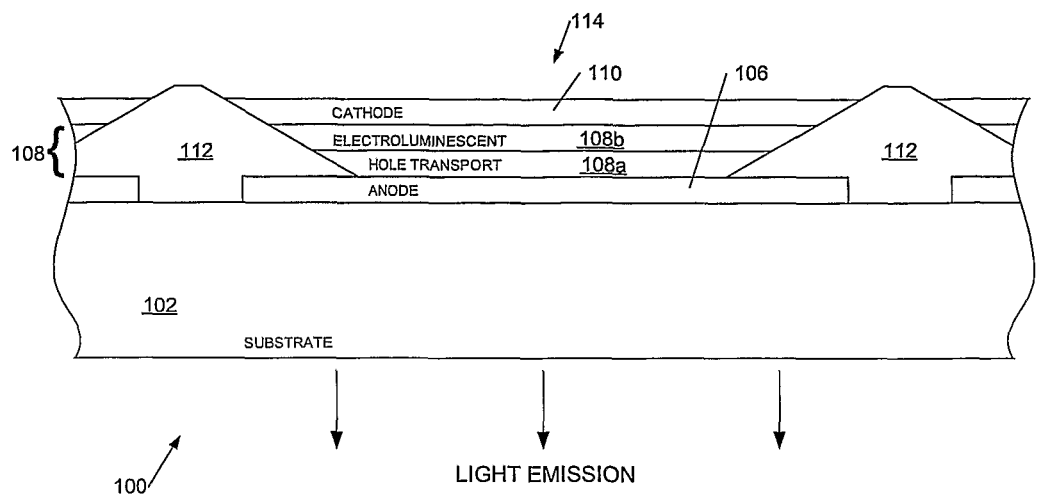
FIG. 1 shows a vertical cross section through an example of an OLED device.
Figure 2:
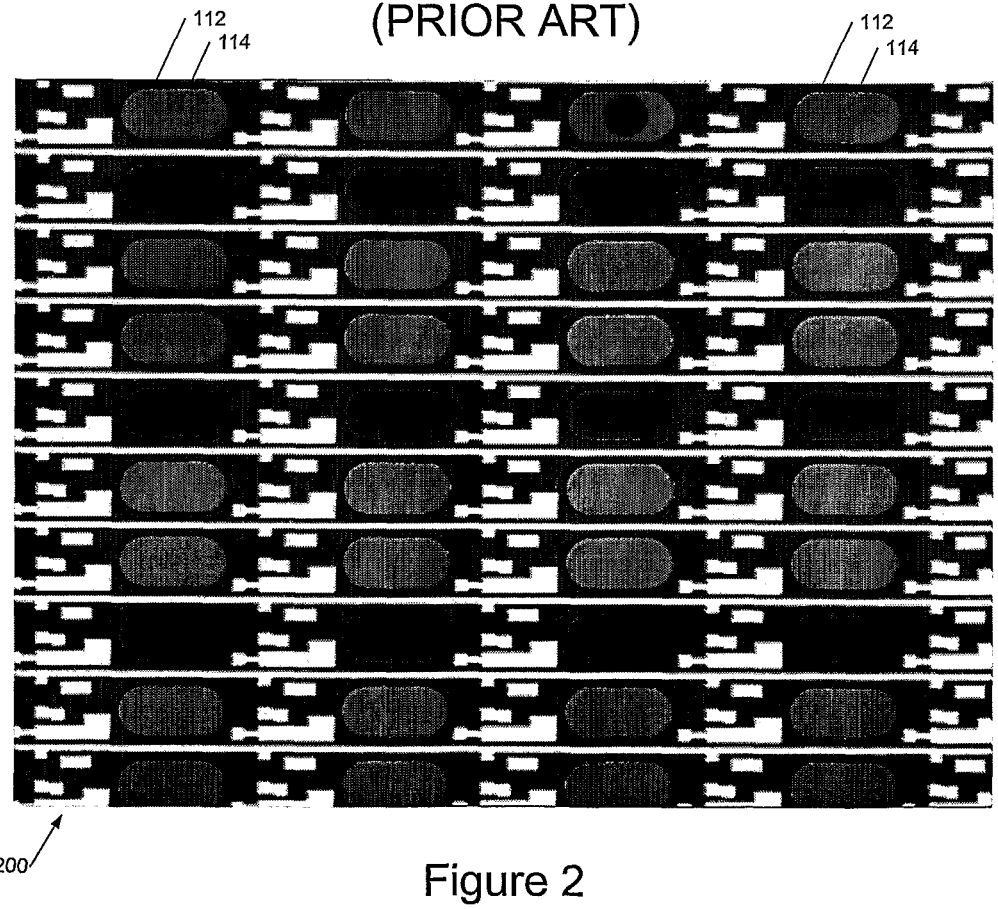
FIG. 2 shows a view from above of a portion of a three colour pixelated OLED display.
Figure 3A:
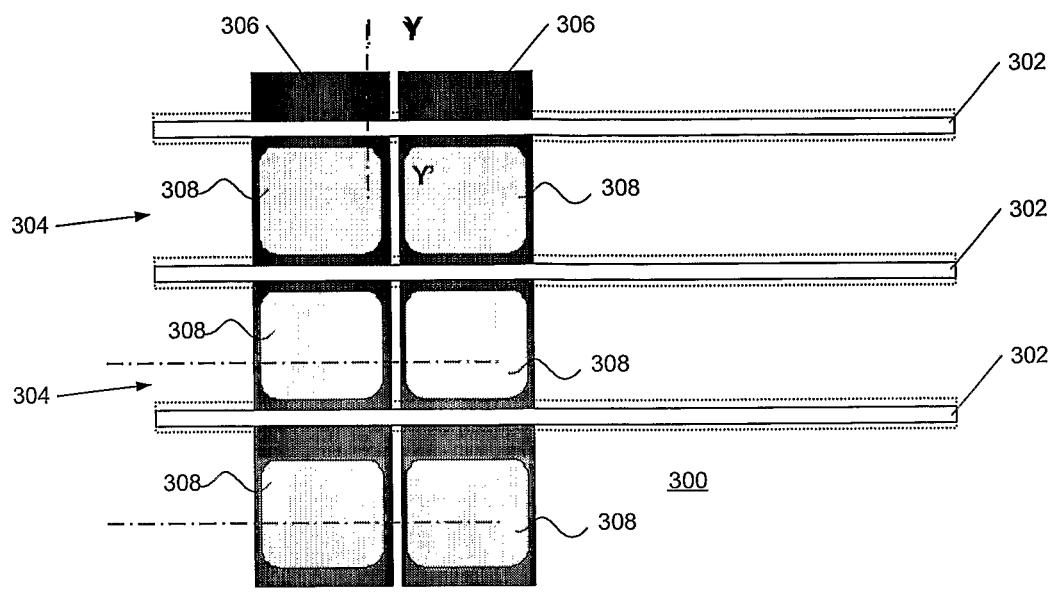
FIGS. 3a and 3b show a view from above and a cross-sectional view respectively of a passive matrix OLED display.
Figure 3B:
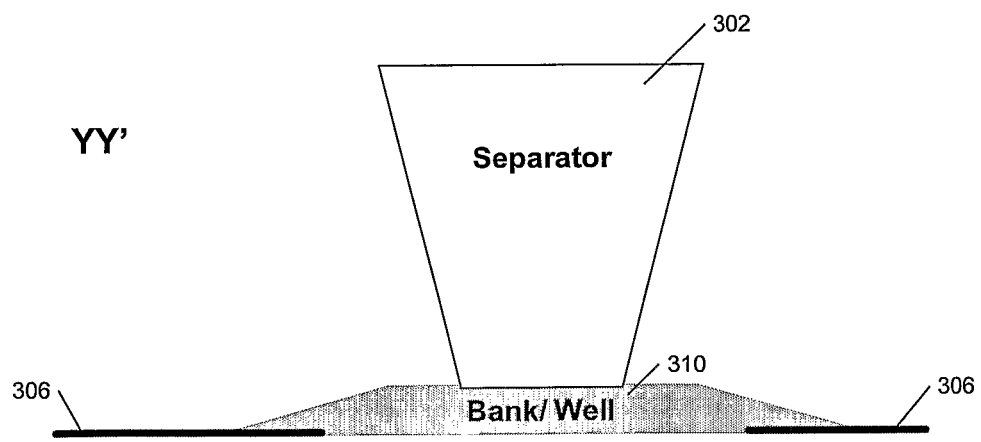
Figure 4A:
FIGS. 4a and 4b show a simplified cross section of a well of an OLED display substrate filled with, respectively, dissolved material, and dry material.
Figure 4B:
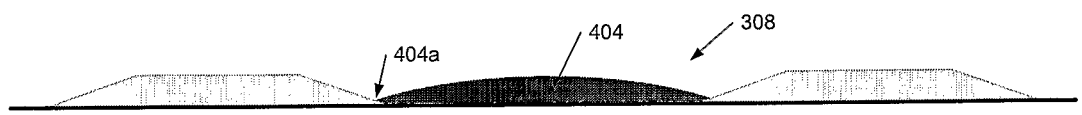
Figure 5A:
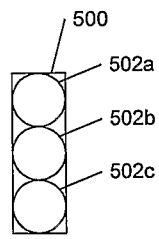
FIGS. 5a and 5b show examples of filling a small pixel and a large pixel respectively with droplets of dissolved OLED material.
Figure 5B:
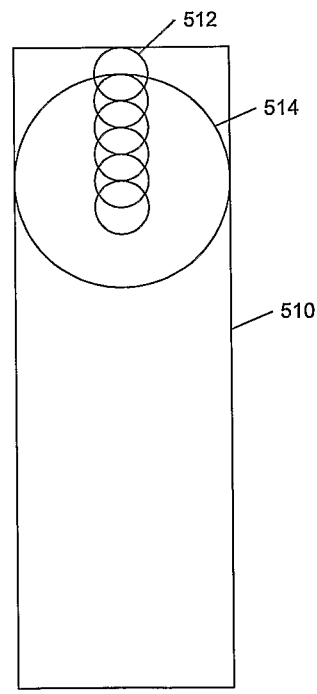
Figure 6:
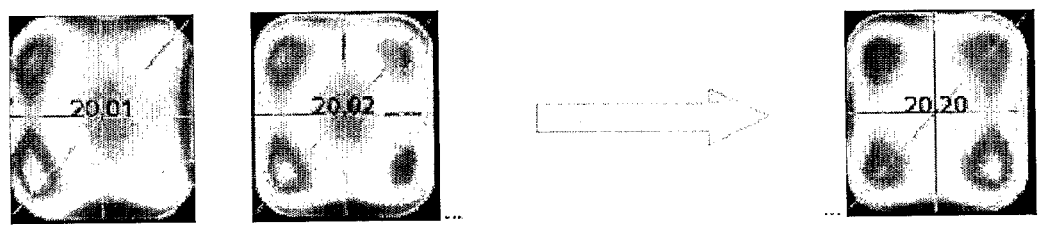
FIG. 6 show asymmetry in the drying profiles of EL ink at a swathe join. The coordinates indicate the row (row 20 in this case) and column number, column 1 is the edge of the swathe. The redder the colour, the thicker the film. Lines indicate where thickness profiles are taken—the horizontal profile is used to calculate centroid position.

The asymmetric drying effect can be seen in FIG. 6. The images show height profiles of an EL ink printed into square wells. The profile changes from asymmetric at the edge of a swathe becoming more symmetric towards the centre of a swathe. In this particular case each pixel was printed with a single nozzle of a Spectra SX head in a Litrex 140P printer that would have been running vertically down the page.

Figure 7:
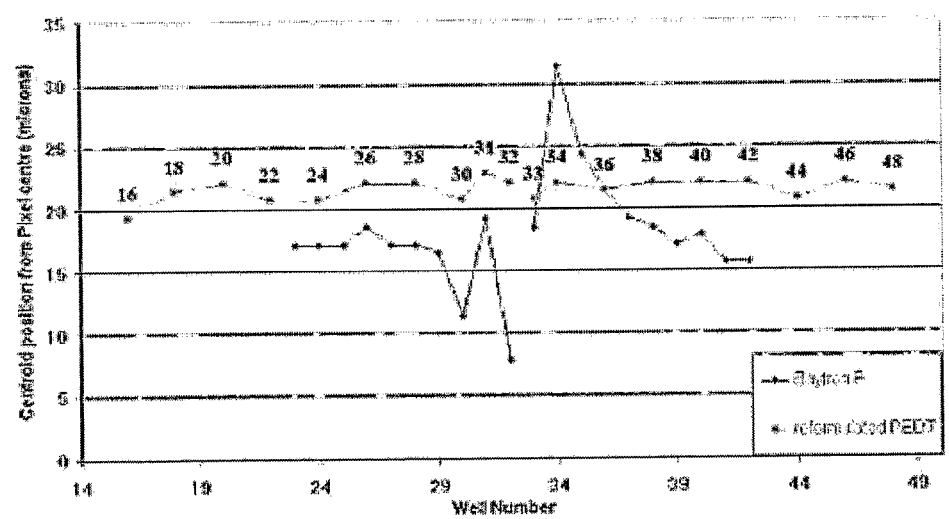
FIG. 7 shows improved film profile with reformulation of Baytron P HC ink. The swathe join occurs between column 32 and 33. Before reformulation the position of the centroid varies by 25 microns.

To quantify the swathe edge non-uniformity so that the effect of changing ink formulation and drying condition can be determined, we calculate the centroid of the film profile in the axis perpendicular to the print direction. This would correspond to the centroid of the profile taken along the horizontal lines shown in FIG. 6. The centroid of ink jet printed PEDOT:PSS (Poly(3,4 ethylenedioxythiophene)/poly(styrenesulfonate), a common HC layer, across a swathe join is shown in FIG. 7. The PEDOT films show a rapid change in the profile around the pixels surrounding the swathe join—in this case occurring between columns 32 and 33. It requires more than five pixels before the centroid becomes unaffected by the swathe join. Non-uniform PEDOT profiles can give rise to non-uniform EL profiles and this in turn leads to nonuniformities in the display [J. Carter, A. Wehrum, M Dowling, M. Cachiero-Martinez, N. Baynes. Recent Developments in Materials and Processes for Ink Jet Printing High Resolution Polymer OLED Displays. Proc SPIE 4800, 34 (2003)].

To overcome the swathe join effect through ink formulation requires the development of inks that dry on a substantially longer timescale than the printing process—requiring the use of higher boiling point solvents in the ink. However, the addition of higher boiling point solvents can have negative impacts on other aspects of the ink's performance. The ink has to meet the requirements for reliable jetting; it has to form films with the necessary film flatness and morphology; and the resultant film has to perform adequately as an electronic material—having suitable efficiency and lifetime for example [J. Carter, A. Wehrum, M Dowling, M. Cachiero-Martinez, N. Baynes. Recent Developments in Materials and Processes for Ink Jet Printing High Resolution Polymer OLED Displays. Proc SPIE 4800, 34 (2003)].

Figure 8:
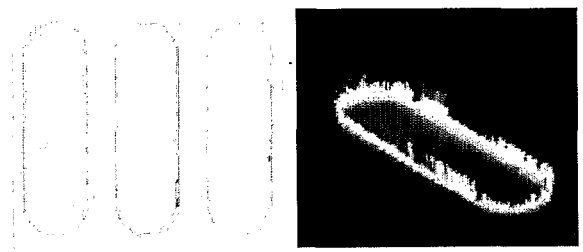
FIG. 8(a) shows a photomicrograph of printed reformulated PEDOT and 8(b) shows a white light interferometry representation of PEDOT film profile in one of the wells—the uniformly coloured areas represent a thickness variation of ±2 nm.

FIG. 7 shows the centroid data for reformulated PEDOT ink that meets the requirements for jetting, film morphology and flatness and performance. This ink shows no discernable variation in film profile across the swathe join. FIG. 8(a) shows photomicrographs of this PEDOT formulation printed into wells and FIG. 8(b) shows the uniformity of the film profile in one of the wells. This ink demonstrates excellent film uniformity.

It has been demonstrated that it is possible to create ink formulations that are insensitive to swathe joins. This has been achieved by creating slower drying inks that don't compromise other aspects of ink performance. The significance of these inks are that, not only do they remove swathe related defects visible in displays, they also make the ink jet process more robust to the size and arrangement of display panels on the substrate.

This scalability function incorporated into the ink can significantly reduce development time by reducing the risks in the transfer of processes from small R&D substrates to larger generation glass sizes.

It has also been demonstrated that inks can behave in a similar way regardless of well geometry. The adaptability function of an ink makes the printing process more capable of being used in products with different size pixels. This functionality significantly reduces tooling costs associated with changing display product. There are limits in how adaptable inks can become due to the fundamental nature of the well filling process, however we have demonstrated that there is significant latitude in the applicability of a single ink to different pixel size.

EXAMPLES 2 new glycerol-based PEDOT formulations were evaluated for swathe joins, printed non-interlaced:

Formulation A: 1% solids content (30:1 PSS:PEDOT), 30% Glycerol, 69% Water

Formulation B: 1% solids content (40:1 PSS:PEDOT), 30% Glycerol, 69% Water

Formulation A

This formulation produced films which were swathe-free in cross-section, and showed dramatically-improved swathe joins when the displays were lit up. There was no evidence of a change in LEP profile on the PEDOT composition at the swathe join. The composition was still well contained within the pixel as was the LEP.

Figure 9:
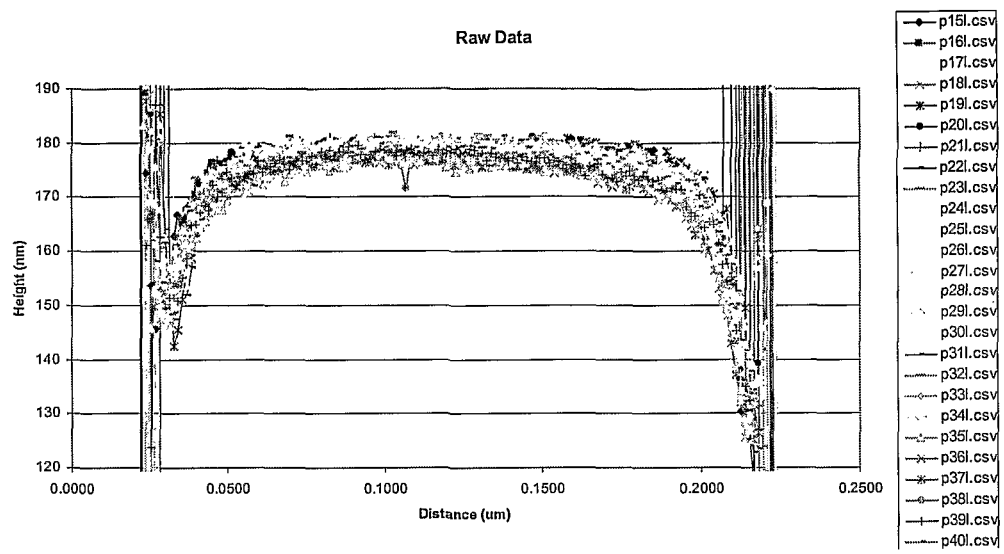
FIG. 9 shows film profiles of conductive polymer for a range of pixels across a display formed using a reformulation of Baytron P HC ink according to an embodiment of the present invention.
Figure 10:
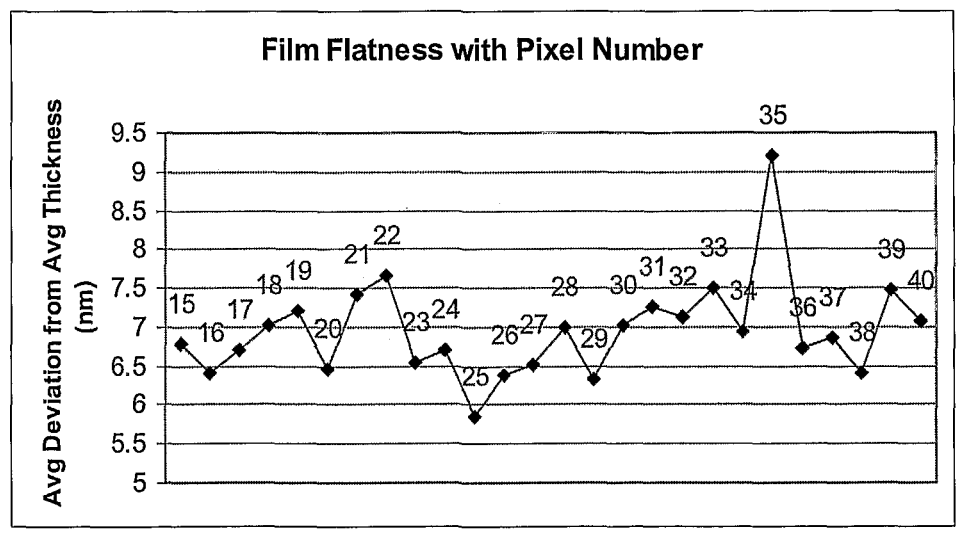
FIG. 10 shows average deviation from the average thickness of the films in FIG. 9.

FIG. 9 shows film profiles for a range of pixels across a display formed using this composition. It can be seen that the profiles across the display are very similar to each other from the $15^{th}$ to the $40^{th}$ pixel. FIG. 10 shows average deviation from the average thickness of the films in FIG. 9. No significant change occurs at the swathe join (30-31 column).

Figure 11:
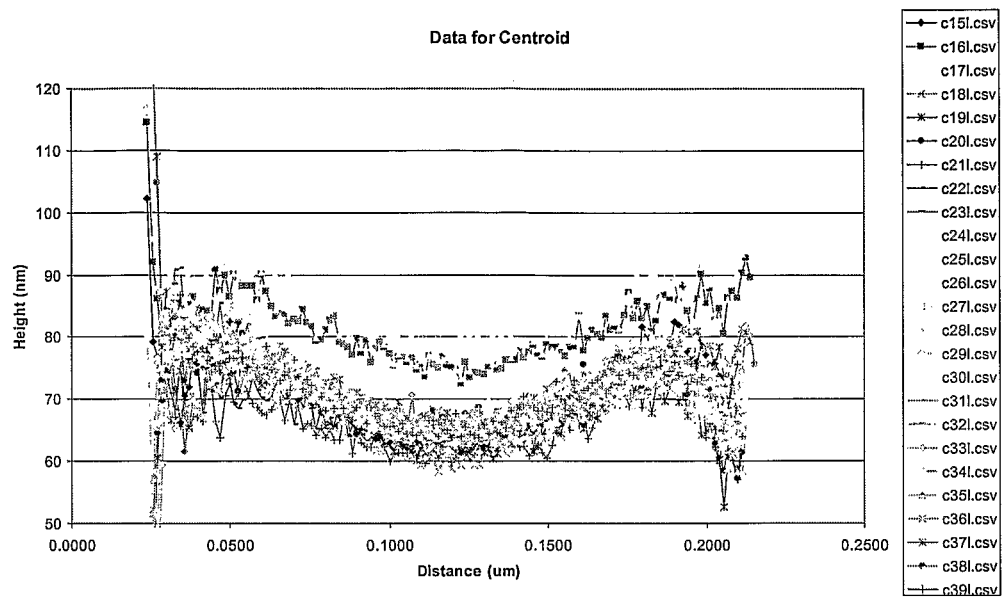
FIG. 11 shows film profiles for electroluminescent material on the conductive films of FIG. 9.
Figure 12:
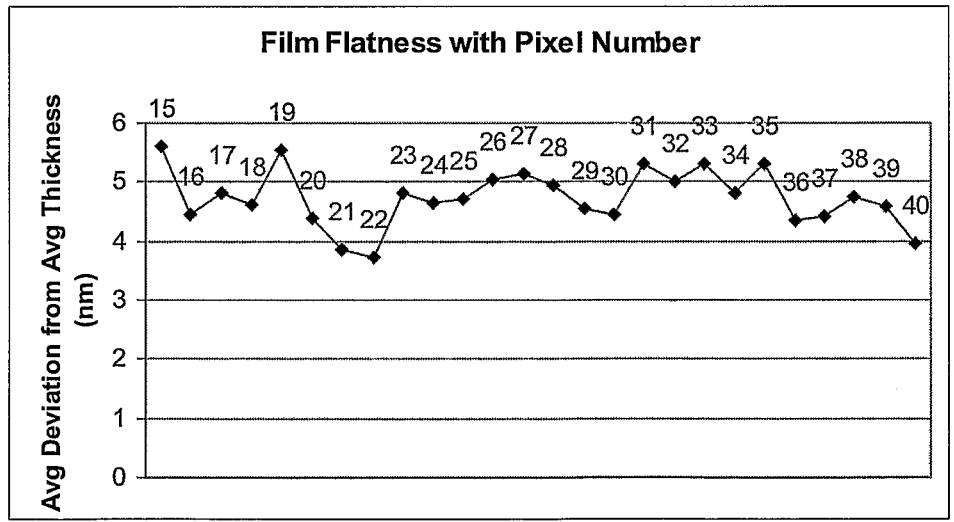
FIG. 12 shows average deviation from the average thickness of the films in FIG. 11.

FIG. 11 shows film profiles for LEP on the conductive films formed using this composition. It can be seen that the profiles across the display are very similar to each other from the $15^{th}$ to the $40^{th}$ pixel (except for 3 bad points 16, 17 and 25). FIG. 12 shows average deviation from the average thickness of the LEP films in FIG. 11. No significant changes occur at the swathe join both for PEDT (24-25 column) and LEP (30-31 column).

Formulation B

This formulation produced films which were swathe-free both in cross-section and when the displays were lit up. The PEDOT formulation was still well contained within the pixels as was the LEP.

Drying Conditions

The new formulations were dried at 100° C. Fast Vacuum to 5e-2 mbar. A temperature of 130° C. for 10 minutes was also successful. First-pass results suggest an improvement in blue emission using the aforementioned formulations and these drying conditions.

Table 1 summarizes a sample range of the compositions formulated to date. The table shows the solid content (PEDOT-PSS), the ratio of PSS:PEDOT, and the % volume of additives in the compositions. Water makes up the remainder of the compositions.

TABLE 1

| % Solids content | PSS:PEDOT ratio | % Additive |
|---|---|---|
| 1.0 | 30:1 | 30% Glycerol |
|  |  | 0.5% 2-Butoxyethanol |
| 1.0 | 30:1 | 30% Glycerol |
|  |  | 2% 2-Butoxyethanol |
| 1.0 | 30:1 | 30% Ethylene glycol |
|  |  | 0.5% 2-Butoxyethanol |
| 1.0 | 30:1 | 30% Ethylene glycol |
|  |  | 2% 2-Butoxyethanol |
| 1.0 | 30:1 | 30% Propylene glycol |
| 1.0 | 30:1 | 30% Propylene glycol |
|  |  | 0.5% 2-Butoxyethano |
| 1.0 | 40:1 | 30% Ethylene glycol |
|  |  | 0.5% 2-Butoxyethanol |
| 1.5 | 40:1 | 30% Ethylene glycol |
|  |  | 0.5% 2-Butoxyethanol |
| 2.0 | 40:1 | 30% Ethylene glycol |
|  |  | 0.5% 2-Butoxyethanol |
| 1.0 | 40:1 | 30% Ethylene glycol |
|  |  | 2% Glycerol |
|  |  | 0.5% 2-Butoxyethanol |
| 1.5 | 40:1 | 30% Ethylene glycol |
|  |  | 2% Glycerol |
|  |  | 0.5% 2-Butoxyethanol |
| 2.0 | 40:1 | 30% Ethylene glycol |
|  |  | 2% Glycerol |
|  |  | 0.5% 2-Butoxyethanol |
| 1.5 | 40:1 | 30% Ethylene glycol |
|  |  | 2% 2-Butoxyethanol |
| 1.5 | 40:1 | 30% Ethylene glycol |
|  |  | 3% 2-Butoxyethanol |
| 1.5 | 40:1 | 30% Ethylene glycol |
|  |  | 5% 2-Butoxyethanol |
| 1.5 | 40:1 | 20% Ethylene glycol |
|  |  | 2% 2-Butoxyethanol |
| 1.5 | 40:1 | 10% Ethylene glycol |
|  |  | 2% 2-Butoxyethanol |

The invention claimed is:

1. A composition for ink jet printing an organic light emissive device, the composition comprising: poly (3,4-ethylene-dioxythiophene)-counterion; water; a high boiling point solvent with a boiling point greater than water; and a conductivity modifier, wherein the conductivity modifier is provided by excess counterion over a poly (3,4-ethylene-dioxythiophene):counterion ratio of 1:20 and wherein the poly (3, 4-ethylene-dioxythiophene):counterion ratio is 1:40.

2. A composition according to claim 1, wherein the high boiling point solvent is a polyol.

3. A composition according to claim 2, wherein the high boiling point solvent comprises a diol or a triol.

4. A composition according to claim 3, wherein the high boiling point solvent comprises one or more of ethylene glycol, glycerol, diethylene glycol, and propylene glycol.

5. A composition according to claim 1, wherein the high boiling solvent is present in the composition in a proportion between 10% and 50% by volume.

6. A composition according to claim 1, wherein the poly (3,4-ethylene-dioxythiophene)-counterion is present in the composition at a solid content of between 0.5-6%.

7. A composition according to claim 1, wherein the counterion is poly(styrenesulfonate).

8. A composition according to claim 1, wherein water is present in the composition in a proportion between 50% and 90% by volume.

9. A composition according to claim 1, wherein the viscosity of the composition is in the range 2 to 30 mPa. at 20 degrees centigrade.

10. A method of manufacturing an opto-electical device comprising ink jet printing a composition according to claim 1.

11. An opto-electrical device formed using the composition of claim 1.

12. A method of manufacturing an organic light-emissive display comprising: providing a substrate comprising a first electrode layer and a bank structure defining a plurality of wells; depositing a conductive organic layer over the first electrode; deposition an organic light-emissive layer over the conductive organic layer; and depositing a second electrode over the organic light-emissive layer, comprising depositing at least one of the conductive organic layer and the organic light-emissive layer by ink jet printing a composition according to claim 1 into the plurality of wells.

13. A method according to claim 12, comprising depositing the conductive organic layer by ink jet printing a composition according to claim 1.

14. A method according to claim 12, wherein the substrate comprises a plurality of cathode separators over the banks.

15. A method according to claim 12, comprising printing the display in swathes.

16. A method according to claim 15, comprising successively printing a first swathe and a second swathe adjacent to each other, the print rate being such that the first swathe does not significantly dry prior to completing printing of the second swathe.

17. A method according to claim 12, wherein the material of the banks and the composition used to deposit the conductive polymer layer are selected wherein a contact angle between said composition and the bank is in the range 30 to 110 degrees.

18. A method according to claim 12, wherein the material of the first electrode and the composition used to deposit the conductive polymer layer are selected wherein a static contact angle between said composition and the first electrode is below 13.5 degrees.

19. A method according to claim 12, comprising vacuum drying the display at a temperature in the range 40 to 150 degrees centigrade.

20. A composition according to claim 1, wherein the high boiling point solvent is present in a proportion between 20% and 40% by volume.

21. A composition for ink jet printing an organic light emissive device, the composition comprising: poly (3,4-ethylene-dioxythiophene)-counterion; water; a high boiling point solvent with a boiling point greater than water; and a conductivity modifier, wherein the conductivity modifier is provided by excess counterion over a poly (3,4-ethylene-dioxythiophene):counterion ratio of 1:20, wherein the poly (3,4-ethylene-dioxythiophene):counterion ratio is between 1:30 and 1:40, wherein the composition further comprises a surfactant in the range 0.1-5% by volume, and wherein the surfactant is a glycol ether.

* * * * *